United States Patent [19]
Alfke

[11] Patent Number: 6,104,211
[45] Date of Patent: Aug. 15, 2000

[54] SYSTEM FOR PREVENTING RADIATION FAILURES IN PROGRAMMABLE LOGIC DEVICES

[75] Inventor: Peter H. Alfke, Los Altos Hills, Calif.

[73] Assignee: Xilinx, Inc., San Jose, Calif.

[21] Appl. No.: 09/151,856

[22] Filed: Sep. 11, 1998

[51] Int. Cl.[7] .......................... G06F 7/38; H03K 19/0175
[52] U.S. Cl. ................................ 326/91; 326/91; 326/39; 326/9; 326/10; 326/11; 326/12; 326/13; 326/14; 326/37; 326/40; 326/41
[58] Field of Search .................................. 326/9, 10, 11, 326/12, 13, 14, 39, 37, 40, 41

[56] References Cited

U.S. PATENT DOCUMENTS

| | | | |
|---|---|---|---|
| 4,621,201 | 11/1986 | Amdahl et al. | 307/219 |
| 5,535,342 | 7/1996 | Taylor | 395/307 |
| 5,590,305 | 12/1996 | Terrill et al. | 395/430 |
| 5,603,043 | 2/1997 | Taylor et al. | 395/800 |

OTHER PUBLICATIONS

"The Programmable Logic Data Book", 1998, available from Xilinx, Inc., 2100 Logic Drive, San Jose, California 95124, pp. 4–56 to 4–59.
Wolfgang Hoflich, Applications Note, "Using the XC4000 Readback Capability", XAPP 015.000, 1993 pp. 8–37 to 8–44.

*Primary Examiner*—Michael Tokar
*Assistant Examiner*—Vibol Tan
*Attorney, Agent, or Firm*—Arthur J. Behiel; Jeanette S. Harms

[57] ABSTRACT

A radiation-tolerant logic circuit includes three similarly configured SRAM-based PLDs. These PLDs work in parallel to provide identical logic functions. To guard against data corruption that can result from radiation-induced upsets, the logic circuit includes a state-comparison circuit that periodically performs a bitwise comparison of the configuration and user data from each of the PLDs; if a bit from one PLD differs from the corresponding bit from the others, the state-comparison circuit sets a flag that indicates that the differing PLD is in error. The erroneous PLD is then reprogrammed using error-free state data. In one embodiment, the error-free state data is read from an error-free PLD.

17 Claims, 2 Drawing Sheets

SYSTEM FOR PREVENTING RADIATION FAILURES IN PROGRAMMABLE LOGIC DEVICES

FIELD OF THE INVENTION

This invention relates generally to programmable logic circuits for aerospace applications, and in particular to redundant systems that tolerate radiation-induced errors.

BACKGROUND

Latches and flip-flops that work perfectly well in terrestrial applications can nevertheless fail in aerospace application. Such failures are often radiation-induced upsets that occur when high-energy radiation changes the state of a latch or flip-flop. Radiation-induced upsets are sometimes called "soft" errors because they do not physically damage the circuit.

FIG. 1 depicts a conventional radiation-tolerant logic circuit 100 connected between an input bus IN and a destination circuit 105. Logic circuit 100 receives logic signals on input bus IN and provides some desired logical results from those signals to destination circuit 105. Circuit 100, typically an integrated circuit, includes combinational logic 110 connected via a line 120 and a clock line CLK to a triple-redundant storage element 130. Triple-redundant storage element 130 includes three flip-flops 132, 134, and 136, each of which includes a "D" input connected to line 120, a clock input connected to the common clock line CLK, and a "Q" output. Flip-flops 132, 134, and 136 function identically to capture the output data from combinational logic 110 upon receipt of a clock edge on clock line CLK. For terrestrial application, where soft errors are extremely rare, only one flip-flop (e.g., flip-flop 132) is required. However, because aerospace applications are subject to occasional soft errors, redundant flip-flops are provided to accommodate the occasional radiation-induced upset.

The "Q" outputs of flip-flops 132, 134, and 136 are connected to a voting circuit 140 that outputs a signal on a line Q that represents the majority logic: provided by flip-flops 132, 134, and 136 on respective lines Q1, Q2, and Q3. Output line Q of voting circuit 140 will therefore correctly represent the output of combinational logic 110 so long as no more than one of flip-flops 132, 134, and 136 is in error. Any soft errors are corrected upon the arrival of a subsequent rising clock edge on line CLK.

The likelihood of a radiation-induced upset disrupting one of flip-flops 132, 134, and 136 during a given clock cycle is remote; the likelihood of radiation-induced upsets affecting more than one of flip-flops 132, 134, and 136 during a given clock cycle is even more so. Circuit 100 therefore offers improved radiation resistance over similar circuits without triple redundancy.

The trouble with circuit 100 is that it does nothing about soft errors that might occur within combinational logic 110. Thus, combinational logic 110 and voting circuit 140 are typically limited to circuit types that are relatively resistant to radiation. Such circuits include antifuse-based programmable logic devices (PLDs). However, antifuse-based PLDs are one-time-programmable, and thereofore cannot later be reprogrammed to provide different functionality. In contrast, SRAM-based PLDs can be reprogrammed, but include very large numbers of latches and flip-flops that might be sensitive to radiation. Radiation-resistant reprogrammable PLDs might be manufactured using special semiconductor processes, but such PLDs would be very expensive relative to PLDs manufactured using standard processes. There is therefore a need for reprogrammable, radiation-tolerant PLDs that can be manufactured using standard semiconductor processes.

SUMMARY

The present invention satisfies the need for radiation-tolerant, SRAM-based PLDs that can be manufactured using standard semiconductor processes. A radiation-tolerant logic circuit in accordance with one embodiment of the invention includes three similarly or identically configured SRAM-based PLDs. These PLDs work in parallel to provide identical logic functions. These logic functions are conventionally defined by configuration data that is loaded into flip-flops and latches in each PLD. Other flip-flops and latches store "user" data, which can change state during PLD operation.

The inventive logic circuit includes a configurable-logic modification (CLM) circuit and a state-comparison circuit, each of which is connected to the three redundant PLDs. The CLM circuit periodically reads state data from each PLD as a serial bit stream. This bit stream, or "readback data," includes a collection of configuration and user data stored in each PLD. The state-comparison circuit then performs a bit-by-bit comparison of the readback data to determine which PLD, if any, includes a readback bit that differs from the corresponding readback bits in the remaining two PLDs. The state-comparison circuit flags any such PLDs as having an error.

Any PLD or PLDs flagged as erroneous is disabled and reprogrammed. If at least one of the three PLDs is error free, then the readback data from that PLD can be used to reconfigure any erroneous PLDs. The present invention thus guards against data corruption that can result from radiation-induced upsets. All three PLDs can also be reconfigured from a common configuration memory in the rare event that they all include errors; however, a reconfiguration from configuration memory may result in a loss of user data.

DETAILED DESCRIPTION

Figure 2:
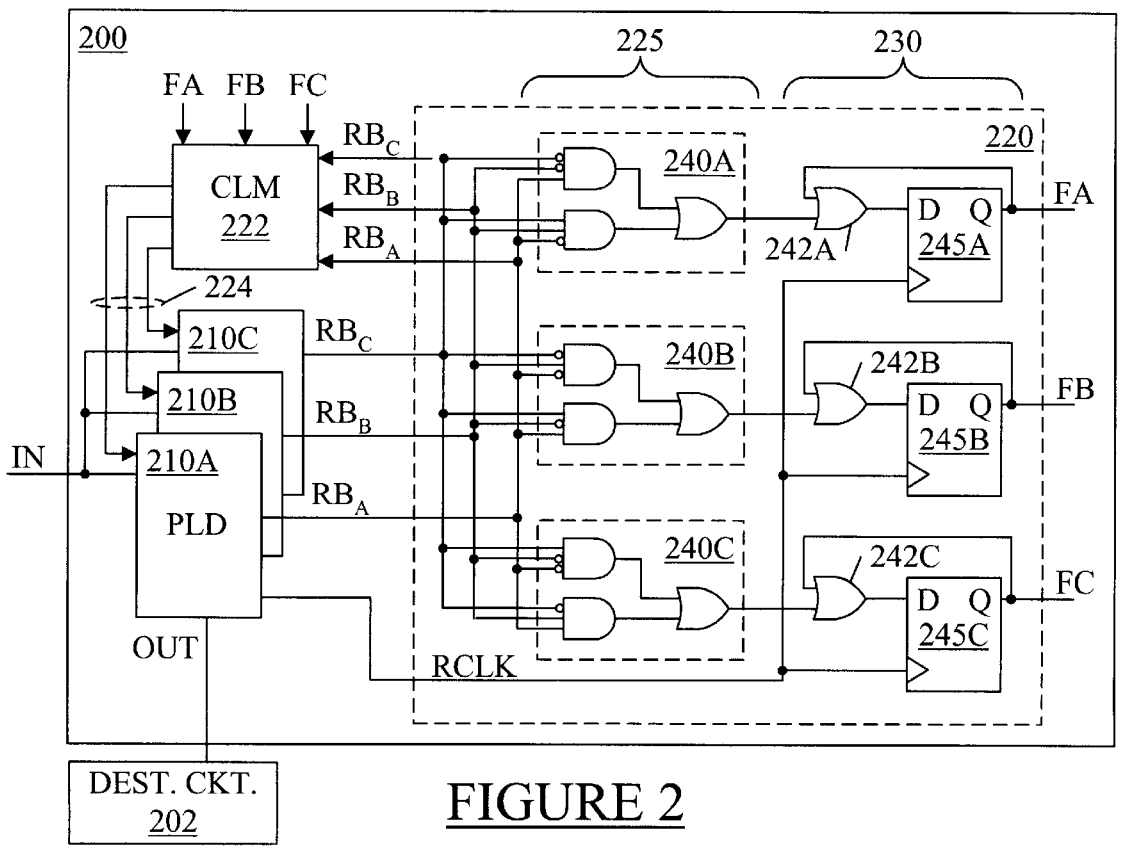
FIG. 2 depicts a radiation-tolerant configurable logic 200 in accordance with the invention.

FIG. 2 depicts a system of radiation-tolerant configurable logic 200 in accordance with the invention. Configurable logic 200 receives logic signals on an input bus IN and provides some desired logical results from those signals to a destination circuit 202 on an output line OUT. Three similarly configured SRAM-based PLDs 210A–C define the logical operation of configurable logic 200. Being SRAM-based devices, PLDs 210A–C may be sensitive to radiation-induced upsets that alter their "states," which ire defined by data stored in a collection of configuration and user-accessible latches and flip-flops in each PLD. Configurable logic 200 therefore includes a state-comparison circuit 220 that periodically compares the state data from a each of PLDs 210A–C to determine whether the state of one differs from the states of the other two, indicating an error. If one of PLDs 210A–C is found to include an error, the erroneous PLD is deactivated and reprogrammed using error-free state data.

Configuring PLDs 210A–C conventionally includes loading specific sets of state data into the PLDs;. This configuration process is controlled by a configurable-logic modification (CLM) circuit 222, which reads state data from either a configuration memory (not shown) or from one or more of PLDs 210A–C. CLM 222 then conveys the state data to one or more of PLDs 210A–C on configuration lines 224. The configuration operations performed by CLM 222 are accomplished by conventional means that are well within the skill of those familiar with configuring PLDS. PLDs 210A–C are, in one embodiment, XC4000™ series FPGAs available from Xilinx, Inc., of San Jose, Calif. CLM circuit 222 may be a radiation-resistant PLD programmed to perform the function described below in connection with FIG. 3.

Figure 1:
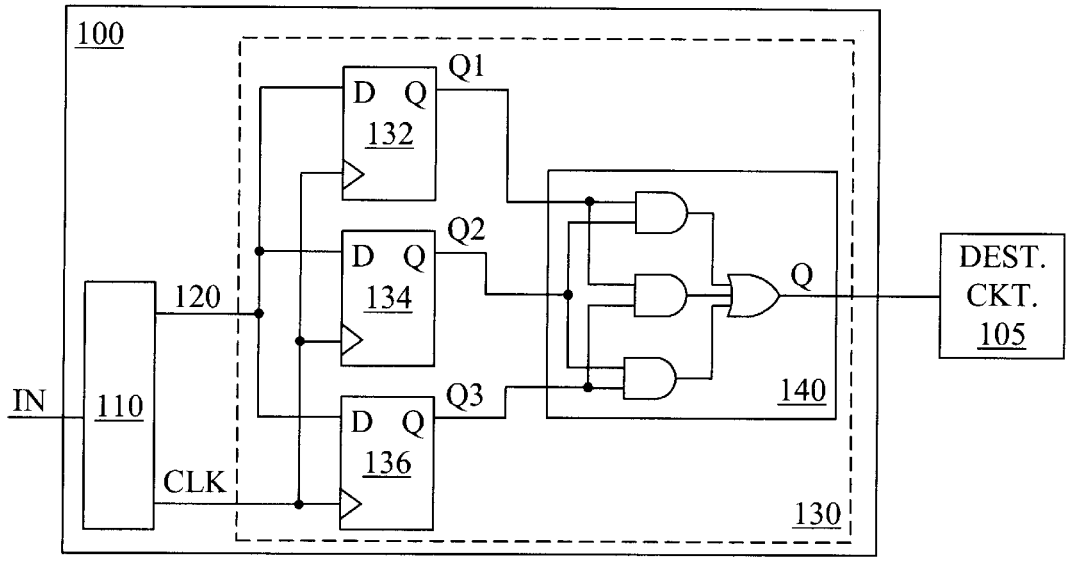
FIG. 1 depicts a conventional radiation-tolerant logic circuit 100 connected to a destination circuit 105.

PLDs 210A–C are similarly configured and connected in parallel (having common input and output pins) so that they perform the same logic functions. The output pins of two PLDs are tri-stated (electrically disconnected) so that only one PLD (e.g., PLD 210A) drives output line OUT to destination circuit 202. In another embodiment, each of PLDs 210A–C has active output pins connected to destination circuit 202 through a radiation-resistant voting circuit similar to voting circuit 140 of FIG. 1.

PLDs 210A–C connect to comparison circuit 220 via respective readback lines $RB_A$, $RB_B$, and $RB_C$. PLDs 210A–C conventionally respond to a readback command from CLM 222 by outputting a bit stream (the readback data) that includes the configuration data and, optionally, the user data within each PLD. PLDs 210A–C can be read back at any time after configuration without interfering with device operation. During readback, the readback data is transferred out of the PLDs on readback lines $RB_A$, $RB_B$, and $RB_C$. For more information relating to readback operations on Xilinx XC4000™ series FPGAs, see Xilinx, Inc., "The Programmable Logic Data Book" (1998), pp. 4-56 to 4-59, and Wolfgang Höflich, "Using the XC4000™ Readback Capability," XAPP 015.000, pp. 8-37 to 8-44 (1993). Both of these documents are available from Xilinx, Inc., of San Jose, Calif., and are incorporated herein by reference.

State-comparison circuit 220 includes a voting section 225 and a ones-catcher section 230. Each section includes three elements, one for each of PLDs 210A–C, as designated by the last character in each alphanumeric element designation. State-comparison circuit 220 is preferably radiation-resistant, and may be incorporated into CLM 222.

Voting section 225 includes three error-identification circuits 240A–C that compare the bit streams on readback lines $RB_A$, $RB_B$, and $RB_C$. If a readback bit from PLD 210A does not match the corresponding bits from PLDs 210B and 210C, then error-identification circuit 240A outputs a logic one. Similarly, circuit 240B outputs a logic one if a bit on line $RB_B$ differs from the corresponding bits on lines $RB_A$ and $RB_C$, and circuit 240C outputs a logic one if the signal on line $RB_C$ differs from the signals on lines $RB_A$ and $RB_B$.

Ones-catcher section 230 includes three identical ones-catchers, the first of which includes an OR gate 242A having an output terminal connected to the "D" input of a flip-flop 245A. OR gate 242A includes two inputs, the first of which is connected to the output of error-identification circuit 240A, and the second of which is connected to the "Q" output of flip-flop 245A. Flip-flop 245A also includes a clock terminal connected to a readback clock via a line RCLK and a reset terminal (not shown). The readback clock synchronizes the readback bitstreams on readback lines $RB_A$, $RB_B$, and $RB_C$; flip-flop 245A use the same readback clock to synchronize the output of circuits 240A with the readback bitstreams. The reset terminal is used to reset flip-flops 245A–C prior to performing a readback comparison.

As discussed above, error-detection circuit 240A outputs a logic one if a configuration bit of PLD 210A does not match the corresponding configuration bits of PLDs 210B and C. Ones-catcher section 230 captures this logic one in flip-flop 245A and conveys the logic one, via a line FA (for "flag A") to CLM 222. Circuits 240B and 240C function similarly to circuit 240A; an explanation of those circuits is therefore omitted for brevity.

Each time a readback cycle is initiated, state-comparison circuit 220 determines which, if any, of PLDs 210A–C includes an error. Should an error occur, the Q output terminal of the one of flip-flops 245A–C corresponding to the erroneous PLD will transition to a logic one. For example, if a bit on readback line $RB_A$ does not match the corresponding bits on readback lines $RB_B$ and $RB_C$, then the Q output of flip-flop 245A will transition to a logic one during the readback cycle. This logic one is transferred to CLM 222 via line FA. Flip-flop 245A will then remain set, indicating a state error in PLD 210A.

Figure 3:
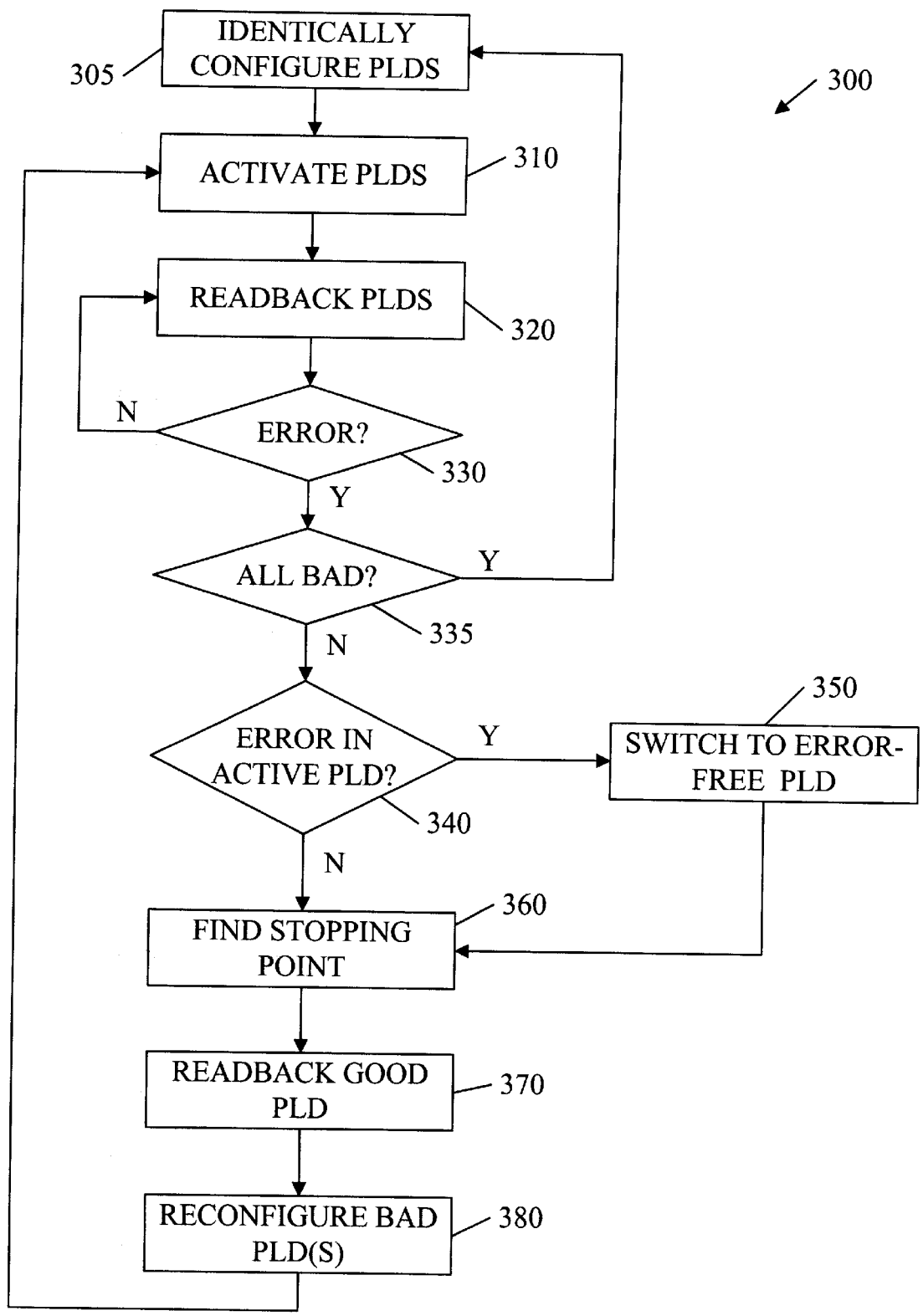
FIG. 3 is a flowchart 300 illustrating the process of detecting and correcting soft errors in PLDs 210A–C of FIG. 2.

FIG. 3 is a flowchart 300 illustrating the process of detecting and correcting soft errors in PLDs 210A–C. Beginning with step 305, CLM 222 identically configures each of PLDs 210A–C from a configuration memory using well-known methods. PLDs 210A–C are then activated (step 310) to perform the logic function for which they were configured.

CLM 222 automatically moves to step 320 once PLDs 210A–C are operational. As discussed above in connection with FIG. 2, comparison circuit 220 compares the respective readback bit streams from PLDs 210A–C. If none of ones-catcher flip-flops 245A–C flags an error, then the process returns to step 320 and begins another readback cycle. If an error is flagged, CLM 222 determines whether any of PLDs 210A–C are error free (step 335). In the unlikely event that all of flip-flops 245A–C flag errors, than none of PLDs 210A–C can be trusted to include correct state data. Thus, CLM 222 returns to step 305, in which PLDs 210A–C are once again identically configured from configuration memory. In this scenario, any user data in PLDs 210A–C is lost.

Soft errors are sufficiently infrequent that all three of PLDs 210A–C will rarely include errors during a given readback cycle. If even one of PLDs 210A–C is deemed error-free, then the process moves to step 340, in which CLM 222 determines whether the active PLD includes an error. Recall that the outputs from PLDs 210B and 210C are tristated and the outputs from PLD 210A are connected to destination circuit 202. If PLD 210A does not include an error, then destination circuit 202 has been receiving error-free data. This being the case, it is not necessary to interrupt the operation of configurable logic 200. The process therefore moves to step 360, in which CLM 222 waits for a logical stopping point (e.g., a pause in operation) before attempting to correct the error. If, on the other hand, PLD 210A includes an error, then destination circuit 202 may be receiving incorrect data. CLM 222 therefore immediately changes the active device from PLD 210A to an error-free PLD (step 350). The process then moves to step 360 to wait for a logical stopping point before beginning the correction process. CLM can be configured to perform additional readback comparisons while waiting for the logical stopping point.

Step 370 marks the beginning of the correction process. CLM 222 reads back the state data from an error-free PLD, ignoring the output of state-comparison circuit 220. Then, using the readback data from the error-free PLD, CLM 222 reconfigures the erroneous PLD or PLDs (step 380). Steps 370 and 380 overlap, so that the erroneous PLD is reconfigured as the error-free state data is read back from the good PLD.

Some embodiments of the invention include PLDs for which the readback data is formatted differently than the state data. CLM 222 is therefore configured to convert the readback data into appropriate state data. For example, readback data is inverted with respect to state data in the XC3000™ families of FPGA available from Xilinx, Inc. The readback data must therefore be inverted to create a configuration bit stream for XC3000™ FPGAs.

Once all of the state data from the "good" PLD is loaded into the remaining PLD or PLDS, all three of PLDs 210A–C once again have identical states. Further, the user data in each PLD is timely, because the source of the user data was an error-free PLD. The three identical PLDs are then reactivated (step 310) and flip-flops 245A–C are reset to prepare them for a subsequent readback sequence.

While the present invention has been described in connection with specific embodiments, variations of these embodiments will be obvious to those of ordinary skill in the art. For example, more then three PLDs can be connected in parallel to improve radiation resistance. Moreover, some components are shown directly connected to one another while others are shown connected via intermediate components. In each instance the method of interconnection establishes some desired electrical communication between two or more circuit nodes (e.g., lines or terminals). Such communication may often be accomplished using a number of circuit configurations, as will be understood by those of skill in the art. Therefore, the spirit and scope of the appended claims should not be limited to the foregoing description.

What is claimed is:

1. A system comprising:
   a. a first programmable logic devise (PLD) having a first input terminal, a first output terminal, and a first readback terminal;
   b. a second PLD having a second input terminal connected to the first input terminal, a second output terminal, and a second readback terminal;
   c. a third PLD having a third input terminal connected to the first input terminal, a third output terminal, and a third readback terminal; and
   d. a state-comparison circuit including:
      i. a first comparison-circuit input terminal connected to the first readback terminal;
      ii. a second comparison-circuit input terminal connected to the second readback terminal; and
      iii. a third comparison-circuit input terminal connected to the third readback terminal.

2. The system of claim 1, further comprising a logic modification circuit having an input terminal connected to the first readback terminal and an output terminal connected to the second PLD, the logic modification circuit adapted to readback state data from the first PLD and configure the second PLD with the state data.

3. The system of claim 1, wherein the state-comparison circuit further comprises an error-identification circuit having:
   a. a first input terminal connected to the first readback terminal;
   b. a second input terminal connected to the second readback terminal;
   c. a third input terminal connected to the third readback terminal; and
   d. an output terminal.

4. The system of claim 3, wherein the state-comparison circuit provides a first logic level on the comparison-circuit output terminal if each comparison-circuit input terminal receives a similar logic level, and wherein the state-comparison circuit provides a second logic level on the comparison-circuit output terminal if one of the comparison-circuit input terminals receives a different logic level than the remaining two comparison-circuit input terminals.

5. The system of claim 3, further comprising a latch having an input terminal connected to the error-identification-circuit output terminal.

6. A system comprising:
   a. a first programmable logic device (PLD) having a first input terminal, a first output terminal, and a first readback terminal;
   b. a second PLD having a second input terminal connected to the first input terminal, a second output terminal, and a second readback terminal; and
   c. a state-comparison circuit including:
      i. a first comparison-circuit input terminal connected to the first readback terminal; and
      ii. a second comparison-circuit input terminal connected to the second readback terminal.

7. The system of claim 6, further comprising a third PLD having a third input terminal connected to the first input terminal, a third output terminal, and a third readback terminal.

8. The system of claim 7, wherein the state-comparison circuit further comprises a third comparison-circuit input terminal connected to the third readback terminal.

9. The system of claim 8, wherein the state-comparison circuit further comprises readback comparison logic adapted to detect differences between signals presented on the first, second, and third readback terminals.

10. The system of claim 9, further comprising a latch having an input terminal connected to the readback comparison logic, the latch adapted to save information indicative of the differences.

11. The system of claim 6, wherein the state-comparison circuit further comprises readback (comparison logic adapted to detect differences between signals presented on the first and second readback terminals.

12. A system comprising:
   a. a plurality of programmable logic devices (PLDs), each having a PLD input terminal, a PLD output terminal, and a readback terminal; and
   b. a state-comparison circuit including a plurality of comparison-circuit input terminals each connected to a respective one of the readback terminals.

13. The system of claim 12, wherein the state-comparison circuit further comprises a voting circuit having:
   a. a plurality of voting-circuit input terminals each connected to a respective one of the plurality of comparison-circuit input terminals; and
   b. a voting-circuit output terminal;
   c. wherein the voting circuit is adapted to provide, on the voting-circuit output terminal, a logic level representing a majority logic level on the comparison-circuit input terminals.

14. The system of claim 13, wherein the state-comparison circuit further comprises a ones catcher having a ones-catcher input terminal connected to the voting circuit output terminal.

15. A method of detecting state errors in a plurality of programmable logic device, the method comprising:
   a. reading data from a first programmable logic device to obtain a first set of state data;
   b. reading data from a second programmable logic device to obtain a second set of state data; and
   c. comparing the first and second sets of state data.

16. The method of claim 15, further comprising:
   a. determining, based on the comparing, whether one of the first or second programmable logic devices has a state error; and
   b. if one of the first or second programmable logic devices has a state error, reconfiguring the erroneous programmable logic devices using error-free configuration data.

17. The method of claim 16, further comprising reading the state data from the one of the first and second programmable logic devices without a state error to obtain the error-free configuration data.

* * * * *